US006909326B2

(12) United States Patent
Jesme

(10) Patent No.: US 6,909,326 B2
(45) Date of Patent: Jun. 21, 2005

(54) AMPLIFIER MODULATION

(75) Inventor: Ronald David Jesme, Plymouth, MN (US)

(73) Assignee: 3M Innovative Properties Comapny, St. Paul, MN (US)

( * ) Notice: Subject to any disclaimer, the term of this patent is extended or adjusted under 35 U.S.C. 154(b) by 0 days.

(21) Appl. No.: 10/814,046

(22) Filed: Mar. 31, 2004

(65) Prior Publication Data

US 2004/0183591 A1 Sep. 23, 2004

Related U.S. Application Data

(62) Division of application No. 09/978,329, filed on Oct. 15, 2001, now Pat. No. 6,737,973.

(51) Int. Cl.[7] .............................................. H03F 3/217
(52) U.S. Cl. ...................... 330/251; 330/207 A; 330/10
(58) Field of Search ............................ 330/251, 207 A, 330/10, 277; 340/572.1

(56) References Cited

U.S. PATENT DOCUMENTS

| 3,919,656 A | 11/1975 | Sokal et al. |
| 4,686,514 A | 8/1987 | Liptak, Jr. et al. |
| 4,739,328 A | 4/1988 | Koelle et al. |
| 4,888,591 A | 12/1989 | Landt et al. |
| 5,055,659 A | 10/1991 | Hendrick et al. |
| 5,179,511 A | 1/1993 | Troyk et al. |
| 5,697,076 A | 12/1997 | Troyk et al. |
| 5,926,093 A | 7/1999 | Bowers et al. |
| 5,929,776 A | 7/1999 | Warble et al. |
| 5,955,950 A | 9/1999 | Gallagher, III et al. |
| 5,959,531 A | 9/1999 | Gallagher, III et al. |
| 6,249,185 B1 | 6/2001 | O'Toole et al. |
| 6,369,694 B1 | 4/2002 | Mejia |
| 6,396,341 B1 * | 5/2002 | Pehlke ........................ 330/10 |
| 6,448,847 B1 * | 9/2002 | Paul et al. .................. 327/563 |
| 6,591,139 B2 * | 7/2003 | Loftin et al. .................. 607/60 |
| 6,621,339 B2 * | 9/2003 | Tripathi et al. ............. 330/136 |
| 6,737,973 B2 | 5/2004 | Jesme |

FOREIGN PATENT DOCUMENTS

| JP | 7-170132 | 7/1995 |
| WO | WO 00/10144 | 2/2000 |

OTHER PUBLICATIONS

Tsai K–C et al.: "A 1.9–GHZ, I–W CMOS Class–E Power Amplifier for Wireless Communication", IEEE Journal of Solid–State Circuits, IEEE Inc., New York, US, vol. 34, NR 7, pp. 962–970, XP000930330, ISSN: 00118–9200, figure 4.

Sokal et al., "Class–E Power Amplifier Delivers 24 W at 27 MHz, at 89–92% Efficiency, Using One Transistor Coasting $0.85," Proceedings—RF Expo East, pp. 118–127, 1993.

Sokal et al., "Class E Switching–Mode RF Power Amplifiers," R.F. Design, 3/7, pp. 33–38 and 41, 1980.

(Continued)

Primary Examiner—Patricia Nguyen
(74) Attorney, Agent, or Firm—Melissa E. Buss

(57) ABSTRACT

In general, the invention is directed to an efficient amplifier for use in radio-frequency identification (RFID) applications. In particular, the invention provides a highly efficient amplifier that requires little power, yet has significant modulation bandwidth to achieve high data communication rates. The amplifier makes use of many components of a class E amplifier including a first transistor, an inductor coupling the first transistor to a power supply, and a shunt capacitor connected in parallel to the first transistor. A second transistor is connected in parallel to the first transistor. A controller selectively controls the first and second transistors to achieve amplitude modulation at a high modulation bandwidth.

16 Claims, 6 Drawing Sheets

OTHER PUBLICATIONS

Wong et al., "An 800 MHz HBT Class–E Amplifier with 74% PAE at 3.0 Volts for GMSK," IEEE Gallium Arsenide IC Symposium, pp. 299–303, 1999.

Worksheet Slides, 2000 IEEE MTT–S International Microwave Symposium, Workshop Notes, Boston, MA, Jun. 11–16, 2000.

Sokal, "Class–E–Switching–Mode High–Efficiency Tuned RF/Microwave Power Amplifier: Improved Design Equations," 2000 IEEE MTT–S International Microwave Symposium, Workshop Notes, Boston, MA, Jun. 11–16, 2000.

* cited by examiner

AMPLIFIER MODULATION

CROSS REFERENCE TO RELATED APPLICATIONS

This application is a divisional of U.S. Ser. No. 09/978,329, filed Oct. 15, 2001 now U.S. Pat. No. 6,737,973, the disclosure of which is herein incorporated by reference.

TECHNICAL FIELD

The invention relates to radio-frequency systems, and more particularly, to amplifier modulation in radio-frequency systems.

BACKGROUND

Radio-Frequency Identification (RFID) technology has become widely used in virtually every industry, including transportation, manufacturing, waste management, postal tracking, airline baggage reconciliation, and highway toll management. One common use of RFID technology is in an Electronic Article Surveillance (EAS) system that is to protect against shoplifting or otherwise unauthorized removal of an article. In particular, an EAS system may be used to detect the presence of EAS markers (tags) that pass through an energizing field. Retail outlets, libraries, video stores and the like make use of RFID technology in conjunction with EAS systems to assist in asset management, organization, and tracking of inventory.

A typical RFID system includes RFID tags, an RFID reader, and a computing device. The RFID reader includes a transmitter that may provide energy or information to the tags, and a receiver to receive identity and other information from the tags. The computing device processes the information obtained by the RFID reader. In general, the information received from the tags is specific to the particular application, but often provides identification for an item to which the tag is fixed, which may be a manufactured item, a vehicle, an animal or individual, or virtually any other tangible article. Additional data may also be provided for the article. The tag may be used during a manufacturing process, for example, to indicate a paint color of an automobile chassis during manufacturing or other useful information.

The transmitter outputs RF signals that create an energizing field, from which the tags receive power, allowing the tags to return an RF signal carrying the information. The tags communicate using a pre-defined protocol, allowing the RFID reader to receive information from multiple tags in parallel, or essentially simultaneously. The computing device serves as an information management system by receiving the information from the RFID reader, and performing some action, such as updating a database or sounding an alarm. In addition, the computing device serves as a mechanism for programming data into the tags via the transmitter.

To transfer data, the transmitter and the tags modulate a carrier wave according to various modulation techniques, including amplitude modulation (AM), phase modulation (PM), frequency modulation (FM), frequency shift keying (FSK), pulse position modulation (PPM), pulse duration modulation (PDM) and continuous wave (CW) modulation. In particular, the transmitter makes use of an amplifier, typically a Class-A or a Class-A/B amplifier, to drive an antenna with a modulated output signal. These amplifiers may require significant power to communicate with the tags. An amplifier may require, for example, 10 watts of power to produce an RF signal having a single watt of power. In other words, a conventional reader may dissipate over 9 watts of power to produce a single watt of output, resulting in approximately 10% efficiency. The heat dissipation requirements and power consumption of such an amplifier are not well suited for a number of applications, including those that require a low-cost, hand-held RF reader. Consequently, conventional hand-held readers may have smaller power outputs, such as 100 milliwatts, but have limited communication ranges and similar power inefficiencies.

SUMMARY

In general, the invention is directed to an efficient amplifier for use in radio-frequency identification (RFID) applications. In particular, the invention provides a highly efficient amplifier that requires little power, yet has significant modulation bandwidth to achieve high data communication rates. The amplifier incorporates many elements of a Class-E amplifier, yet overcomes bandwidth and other limitations typically inherent in such an amplifier.

In one embodiment, the invention is directed to an apparatus for producing an amplitude modulated RF signal to communicate with an RFID tag. The apparatus makes use of a class E amplifier that includes a first transistor. A second transistor is used to connect a current path in parallel to the first transistor. The current in this path may be limited by a series resistor or other means. A controller selectively controls the first and second transistors to achieve 100% amplitude modulation at a high modulation bandwidth.

In another embodiment, the invention is directed to an apparatus for producing an amplitude modulated RF signal having less than 100% amplitude modulation, such as 10% amplitude modulation. The apparatus comprises a class E amplifier having a first transistor and an inductor coupling the first transistor to a supply voltage via a first resistor. A second transistor is connected in parallel to the first resistor. A controller is coupled to the first and second transistors. By activating and deactivating the second transistor, the controller varies the supply voltage and causes amplitude modulation of the produced RF signal.

In another embodiment, the invention is directed to a radio-frequency identification (RFID) reader that comprises an amplifier that produces an amplitude modulated signal. The amplifier includes an inductor coupling a first transistor and a shunt capacitor to a power supply via a first resistor. A second transistor within the amplifier is used to connect a current path in parallel to the first transistor. A third transistor is connected in parallel to the first resistor. A controller selectively controls the first, second and third transistors. The RFID reader includes an antenna to receive the amplitude modulated signal and output an RF communication.

In another embodiment, the invention is directed to a method of generating an amplitude modulated signal. A first transistor of a class E amplifier is modulated at a frequency for a first period of time. When modulating the first transistor, a second transistor connected in parallel to the first transistor is deactivated. The first transistor and the second transistor are then simultaneously deactivated and activated, respectively, for a second period of time.

The invention provides many advantages. Unlike conventional Class-E amplifiers that are limited to relatively narrow modulation bandwidth, the inventive amplifier described herein is able to achieve substantially increased data transmission rates. In particular, the large inductance of a conventional Class-E amplifier resists rapid amplitude modulation of the current passing through it, thus rapid amplitude modulation of the RF energy produced by the conventional Class-E amplifier is resisted. By utilizing a second transistor in parallel with the first transistor, and selectively activating and deactivating the transistors, the current of the inventive amplifier does not decay and rebuild during modulation, as with conventional Class-E amplifiers, but rather, the current level remains relatively constant. In addition, the inventive amplifier requires less power than other amplifiers typically used to achieve higher bandwidth. Accordingly, the invention provides reduced heat dissipation requirements, thereby reducing the need for costly heat sinks and batteries. Accordingly, the amplifier may be used in a fully portable, hand-held RFID reader that can conform to RFID standards requiring a higher modulation frequency.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
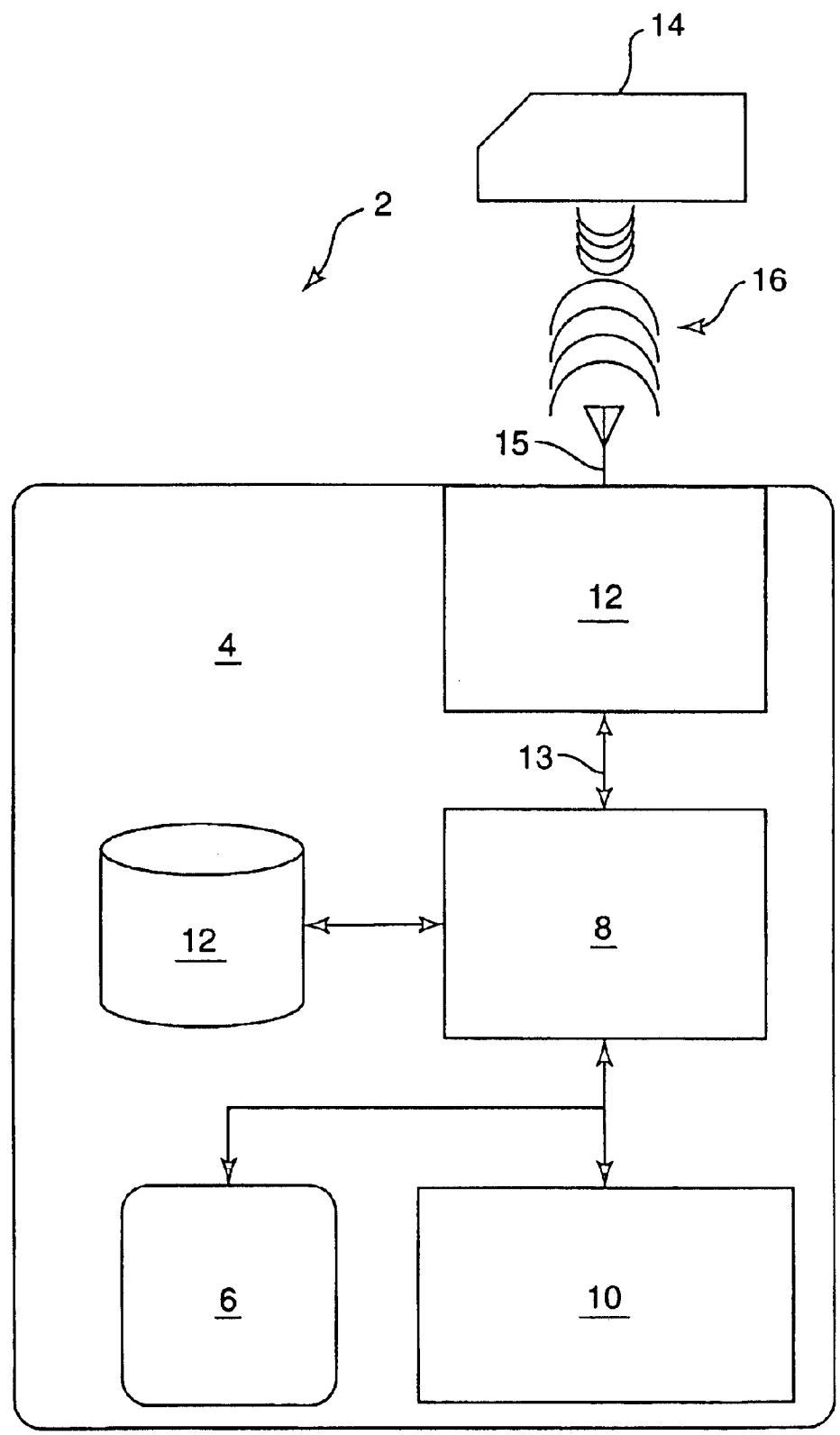
FIG. 1 is a block diagram illustrating an example Radio-Frequency Identification (RFID) system.

FIG. 1 is a block diagram illustrating an example Radio-Frequency Identification (RFID) system 2. RFID system 2 includes an RFID station ("station") 4 that interacts with tag 14 via radio frequency signals 16. In particular, station 4 includes RFID reader ("reader") 12 that provides energy to tag 14, and receives information from tag 14, by producing and receiving RF communications 16 via antenna 15. Reader 12 and tag 14 communicate using RF communications 16 that are amplitude modulated according to a defined protocol, such as the ISO/IEC 14443 and ISO/IEC 15693 standards specify.

Station 4 provides a workstation or other computing environment for processing the information received from tag 14, and for providing tag programming information to reader 12. Station 4 includes, for example, processor 8 that communicates with reader 12 via communication link 13. Reader 12 may be internal to station 4, as illustrated, or may be external or even a hand-held, portable reader. Accordingly, link 13 may be an RS-232 serial communication link, a wireless link, or other suitable connection for exchanging information with reader 12.

Processor 8 maintains data 11 that represents a compilation of the various articles, tags and associated information. An operator interacts with station 4 via input device 10 and display 6. Processor 8 receives the input from the operator and, in response, updates data 11. The operator may provide, for example, identity or other information describing an article to which tag 14 is affixed. Data 11 may contain, for example, a bar code database storing bar code information for the articles. Processor 8 communicates the information to reader 12 via link 13, which outputs appropriate RF signals 16 to program tag 14. Processor 8 may store data 11 on any suitable computer-readable medium, such as random access memory (RAM), non-volatile memory, a magnetic medium, and the like.

As described in detail below, reader 12 incorporates a highly efficient amplifier that requires little power, yet achieves significant data rate. In particular, the amplifier incorporates many elements of a Class-E amplifier, yet overcomes the modulation bandwidth limitations inherent in such an amplifier. Accordingly, RFID reader 12 can conform to RFID standards requiring a wider modulation bandwidth. The efficiency and reduced power requirements of the amplifier allow reader 12 to achieve reduced size and weight. Consequently, reader 12 may be readily incorporated into a desktop workstation or a portable hand-held computing device, such as personal data assistant (PDA) or the like.

Figure 2:
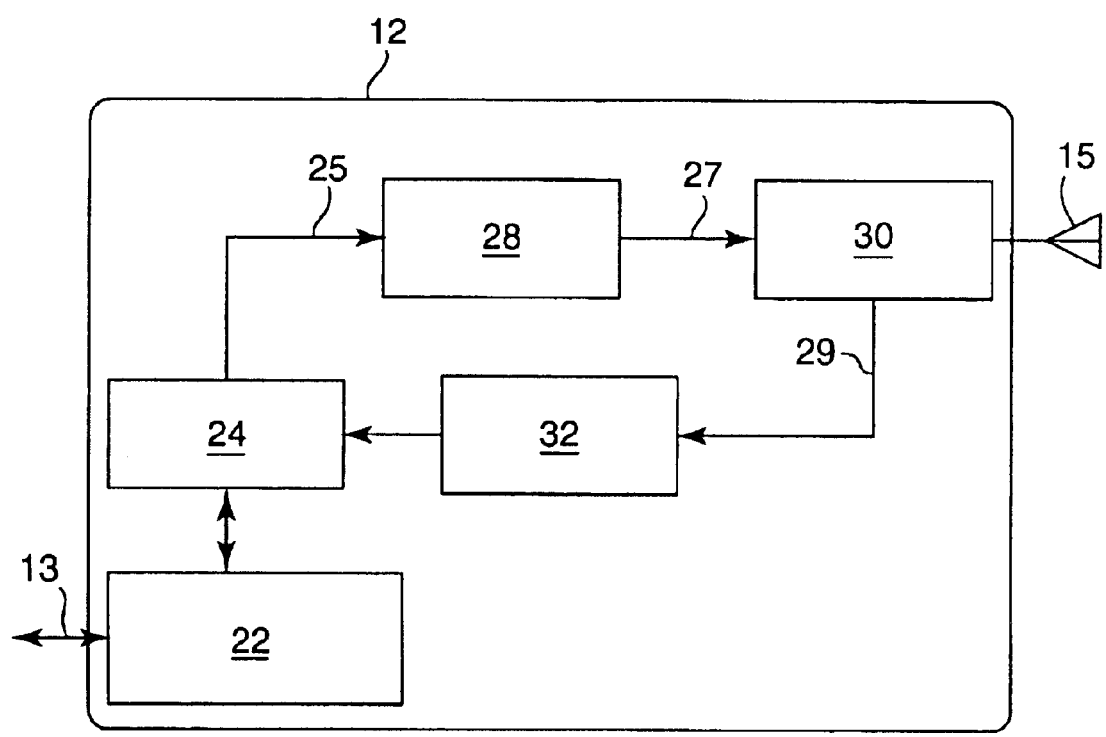
FIG. 2 is a block diagram illustrating an example RFID reader.

FIG. 2 is a block diagram illustrating an example embodiment for reader 12. Communication interface 22 receives programming information from station 4 via link 13, and forwards the information to controller 24. During transmission, controller 24 directs amplifier 28 via control lines 25 to efficiently produce an amplitude-modulated signal 27 in accordance with a modulation scheme, such as 100% amplitude modulation. Amplifier 28 incorporates many elements of a Class-E amplifier, yet overcomes the modulation bandwidth limitations inherent in such an amplifier.

Coupler 30 receives signal 27 and provides signal 27 to antenna 15 for transmission as an RF communication. Coupler 30 also provides receiver 32 with a signal 29 representative of an inbound RF communication received via antenna 15. Receiver 32 extracts digital information from signal 29, typically by demodulating the signal, and forwards the information to controller 24 for communication to station 4 via communication interface 22.

Figure 3:
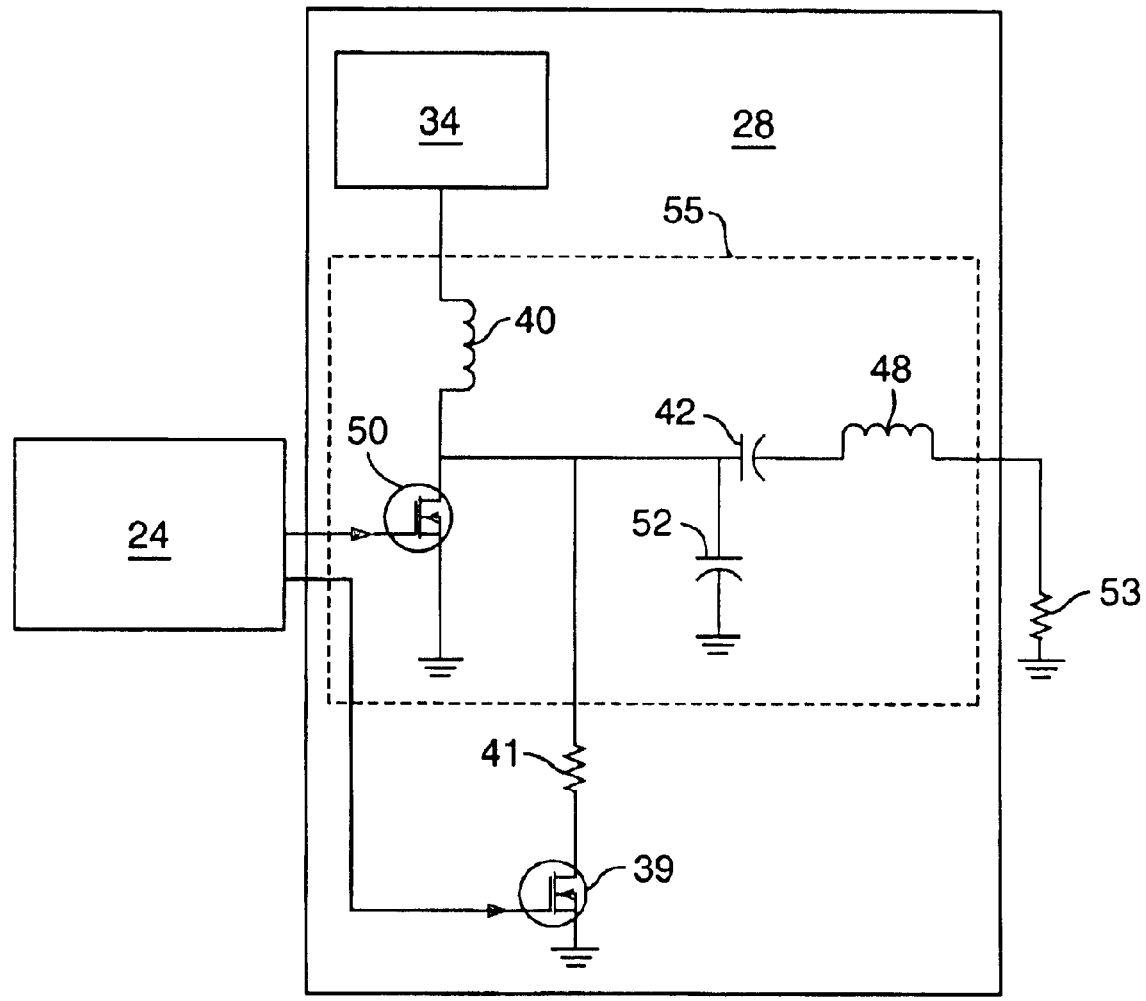
FIG. 3 is a schematic diagram illustrating an example amplifier for use within the RFID reader.

FIG. 3 is a schematic diagram illustrating an example amplifier 28 that efficiently produces a 100% amplitude modulated signal for transmission by antenna 15 (FIG. 2). Amplifier 28 includes a number of components that are arranged as a typical Class-E amplifier, outlined in FIG. 3 by dotted lines 55. In particular, inductor 40 acts as a current source for amplifier 28, and is coupled to a supply voltage 34. Amplifier transistor 50 connects inductor 40 to ground, and may be a metal oxide semiconductor field-effect (MOSFET) transistor having a drain connected to inductor 40 and a source to ground.

Controller 24 is connected to a gate of amplifier transistor 50, which is operated as a switch in response to a control signal. In particular, application of a positive bias voltage to the gate of amplifier transistor 50 causes a large current to flow from supply voltage 34, through inductor 40 to ground. Shunt capacitor 52 holds the voltage on the drain of amplifier transistor 50 during on-to-off switch transition, thereby avoiding switching losses. Resistor 53 represents the load of amplifier 28, i.e., antenna 15 (FIG. 2). Capacitor 42, inductor 48 and resistor 53 are designed such that the drain voltage of amplifier transistor 50 falls back to zero prior to the off-to-on switch transition, again avoiding switching losses.

In addition to these components, amplifier 28 includes bias transistor 39 coupled to resistor 41, and connected in parallel to amplifier transistor 50 and shunt capacitor 52. As described in detail below, bias transistor 39 provides a second path for supply current from inductor 40 when amplifier transistor 50 is open. In particular, a drain of bias transistor 39 is coupled to inductor 40 via resistor 41. A source of bias transistor 39 is connected directly to ground.

Controller 24 selectively activates transistors 39 and 50 to cause amplifier 28 to produce an output signal in which an envelope for the signal is 100% amplitude modulated. In particular, controller 24 switches the amplifier transistor 50 at a high-frequency, such as 13.56 MHz, while holding open bias transistor 39. Switching amplifier transistor 50 causes energy to be stored within inductor 40, and current to periodically flow through amplifier transistor 50. As a result, amplifier 28 produces an output signal having an envelope of 100% amplitude.

After switching amplifier transistor 50 for a period of time, controller 24 then simultaneously deactivates amplifier transistor 50, and activates bias transistor 39 for a second period of time. During this period, current flows from inductor 40 to ground via resistor 41 and bias transistor 39, reducing the envelope of the output signal to substantially 0%. In this manner, controller 24 maintains current flow through inductor 40 and prevents the energy stored within inductor 40 from decaying.

When controller 24 initiates switching of transistor 50 during subsequent modulation cycles, current through inductor 40 is not needed to re-energize inductor 40, since the stored energy in inductor 40 was maintained, thus allowing for a shorter rise time from 0% amplitude to 100% amplitude. Consequently, amplifier 28 can achieve increased data transfer rates. In one embodiment, supply voltage 34 provides five (5) volts, while resistors 53 and 41 have resistances of 12 and 24 ohms, respectively. Capacitors 52, 42 have capacitances of 150 and 50 picoFarads, respectively, and inductors 40, 48 have inductance of 25 and 3 microHenries, respectively. In addition, bias transistor 39 and amplifier transistor 50 may be metal oxide semiconductor field-effect transistors (MOSFET's).

Figure 4:
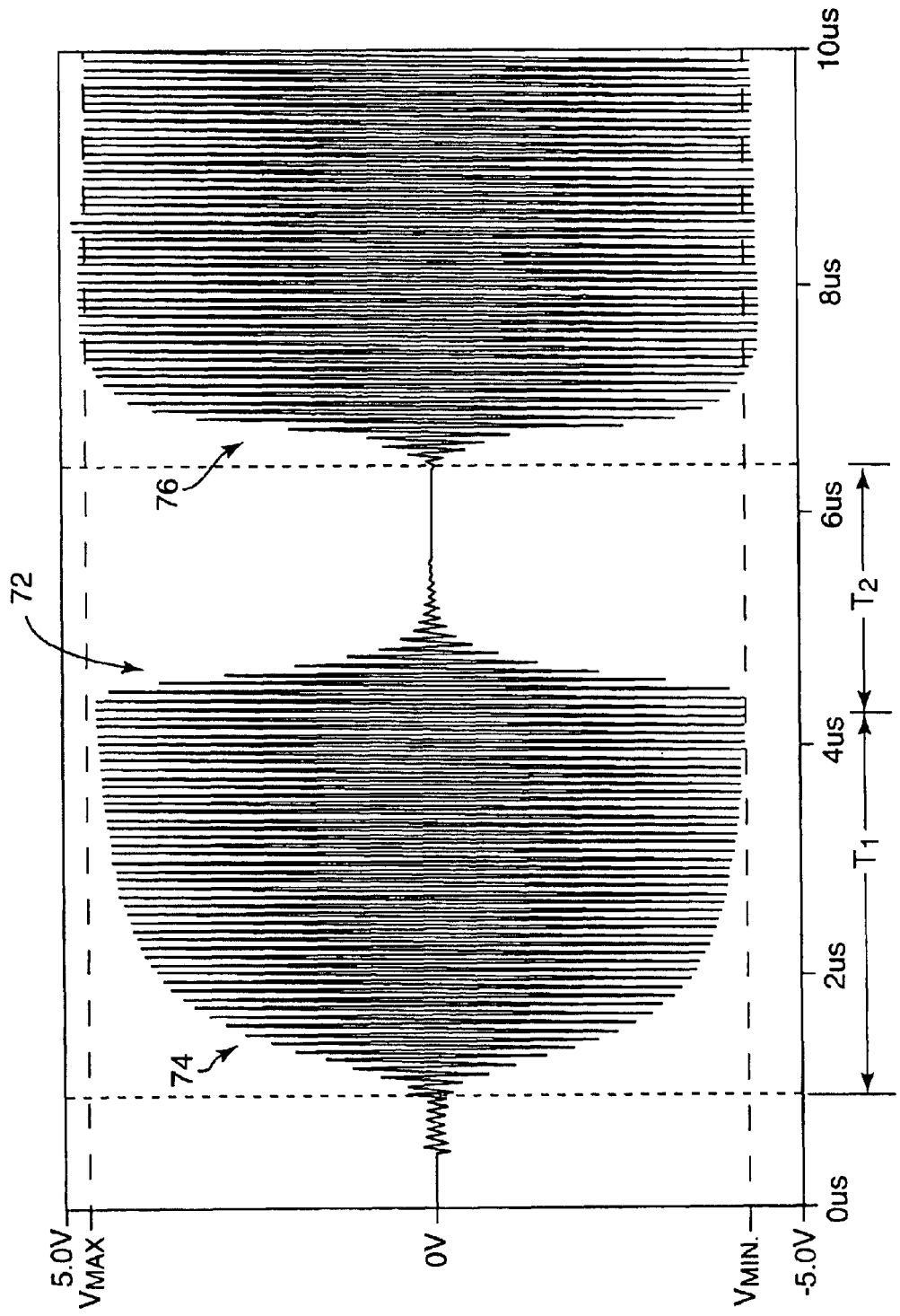
FIG. 4 is a graph illustrating an exemplary amplitude modulated signal.

FIG. 4 is a graph illustrating an output signal 72 produced by amplifier 28, and which has an envelope that achieves 100% amplitude modulation. In particular, output signal 72 represents the voltage across resistor 53 (FIG. 3). The envelope of signal 72 switches between a maximum voltage ($V_{MAX}$) and a minimum voltage ($V_{MIN}$) for a first time period $T_1$. During a second time period $T_2$, output signal 72 has a voltage of approximately 0 volts.

The simulation illustrated in FIG. 4 assumes that amplifier transistor 50 and bias transistor 39, as well as supply voltage 34, are initially off. At 0.1 $\mu$s, controller 24 begins a first cycle of amplitude modulating output signal 72 by switching amplifier transistor 50 at a high frequency, such as 13.56 MHz, e.g., with a 50% duty cycle. In addition, controller 24 maintains bias transistor 39 in an off state. At approximately 4.2 $\mu$s, and after switching amplifier transistor 50 for a time period T1, controller 24 simultaneously activates bias transistor 39 and deactivates amplifier transistor 50. During this period, current flows through inductor 40 to ground via resistor 41 and transistor 39, causing output signal 72 to have an amplitude of substantially zero volts.

At approximately 6.2 $\mu$s, and after delaying for a time period T2, controller 24 begins a second cycle 76 of amplitude modulation. In particular, controller 24 deactivates bias transistor 39 and begins switching amplifier transistor 50. In this manner, the current flowing through inductor 40 is maintained at all times, preventing current decay which is typically experienced by conventional Class-E amplifiers.

As a result, the envelope of output signal 72 more quickly reaches 100% amplitude during the second cycle 76, and for subsequent cycles, than for the first cycle 74. Consequently, amplifier 28 is able to achieve higher data rates than conventional Class-E amplifiers. In addition, a shorter rise time during amplitude modulation is advantageous when communicating with multiple tags simultaneously and, in particular, avoiding collisions between communications from the various tags. Yet another advantage of biasing the current through the inductor 40 is the attenuation of ringing within output signal 72 that otherwise is inherent in Class-E amplifiers due to the RLC components.

Figure 5:
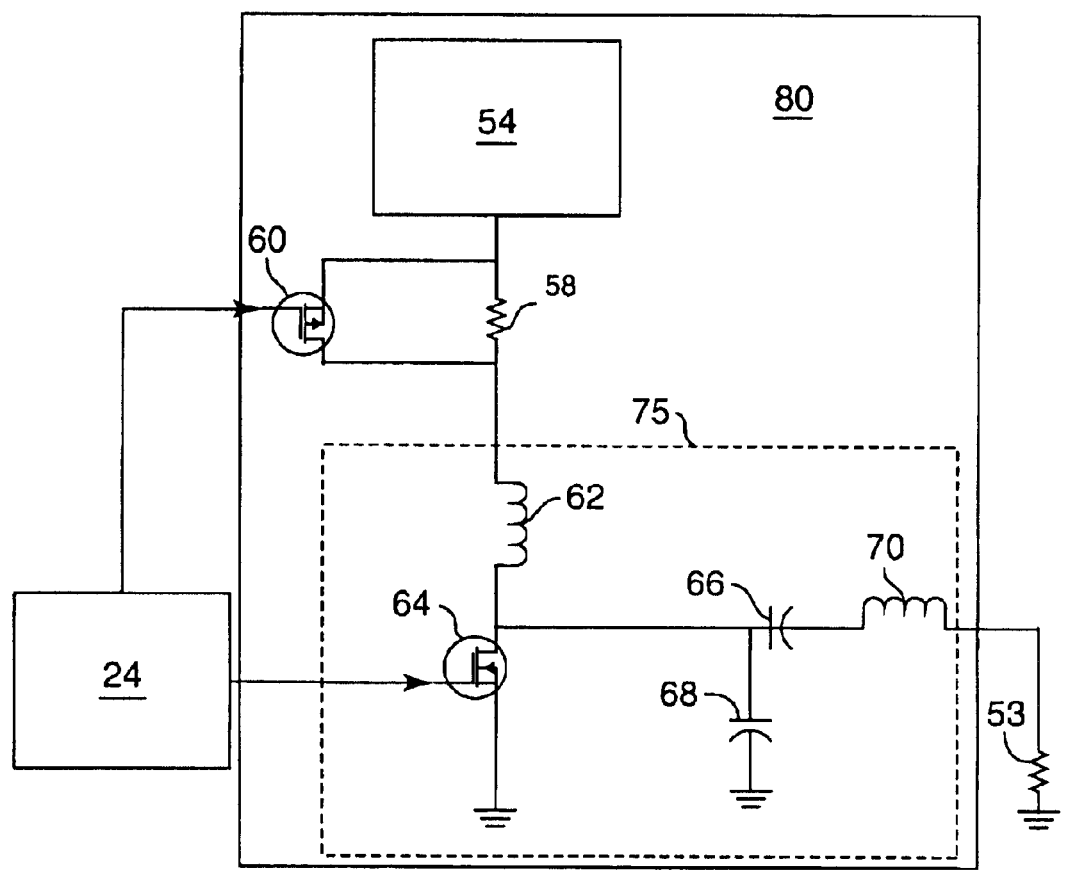
FIG. 5 is a schematic diagram illustrating another example amplifier for use within the RFID reader.

FIG. 5 is a schematic diagram illustrating another example amplifier 80 for use within reader 12. In particular, amplifier 80 produces an output signal having less than 100% amplitude modulation, such as 10% amplitude modulation. Similar to amplifier 28 described above, amplifier 80 includes a number of components 62, 64, 66, 68, 70 that are arranged as a typical Class-E amplifier, outlined by dotted lines 75.

In addition to these components, amplifier 80 includes a modulation transistor 60 connected in parallel to resistor 58, which connects inductor 62 to supply voltage 54. In particular, modulation transistor 60 may be a MOSFET transistor having a source and a drain connected across resistor 58. By activating and deactivating modulation transistor 60, controller 24 varies the supply voltage received by inductor 62, and causes amplitude modulation of the output signal produced by amplifier 80.

Figure 6:
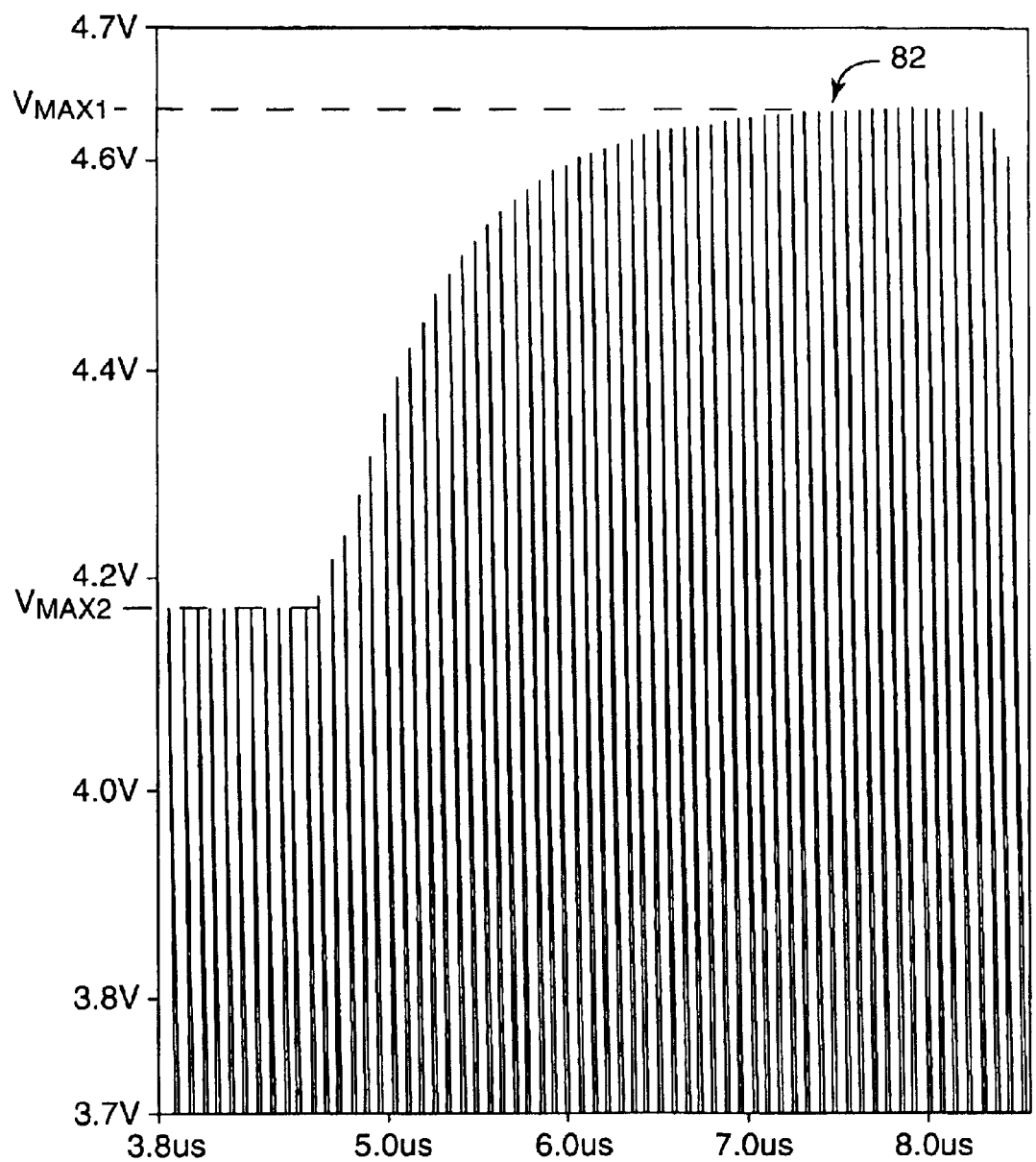
FIG. 6 is a graph illustrating another amplitude-modulated signal.

FIG. 6 is a graph illustrating a portion of an envelope of output signal 82 produced by amplifier 80, in which the envelope achieves 10% amplitude modulation. In particular, the envelope of signal 82 modulates between peak voltage amplitudes of a first maximum voltage ($V_{MAX1}$) and a second maximum voltage ($V_{MAX2}$). $V_{MAX2}$ may be, for example, approximately 90% of $V_{MAX1}$.

The simulation illustrated in FIG. 6 assumes that at 0.0 $\mu$s (not shown), controller 24 begins a first modulation cycle by switching amplifier transistor 64 at a high frequency, such as 13.56 MHz, with a 50% duty cycle. In addition, controller 24 deactivates modulation transistor 60, causing current to flow through resistor 58, and supply voltage 54 to drop across resistor 58. Consequently, at 3.8 $\mu$s the envelope of signal 82 has a peak voltage of $V_{MAX2}$.

At approximately 4.8 $\mu$s, and after switching amplifier transistor 64 for a time period, controller 24 activates modulation transistor 60, causing current to bypass resistor 58, and increasing the envelope of signal 82 from $V_{MAX2}$ to $V_{MAX1}$. In this manner, controller 24 amplitude modulates output signal 82. In one embodiment, 10% amplitude modulation is achieved by selecting supply resistor 58 to have a resistance of 2 ohms. The various components of amplifier 80, however, can be selected to achieve other desired modulation schemes.

Various embodiments of the invention have been described, including embodiments for producing amplitude modulated RF signals to communicate with an RFID tag. The apparatus makes use of many of the components of a conventional class E amplifier. Notably, advantages may be achieved by incorporating the embodiments described above into a single RFID reader. The reader may, for example, readily support multiple modulation schemes, such as 100% and 10% amplitude modulation, by incorporating the embodiments described above. Accordingly, the reader could readily selectively use the embodiments to support a variety of tag types. In addition, the reader may also use the bias transistor while achieving amplitude modulation with the modulation transistor. This may be advantageous in reducing the rise time during a modulation scheme of less than 100% amplitude modulation. These and other embodiments are within the scope of the following claims.

What is claimed is:

1. An apparatus comprising:
    a class E amplifier having a first transistor;
    a second transistor controlling a current path in parallel to the first transistor, and further wherein the second transistor has a source connected to ground and a drain connected to a drain of the first transistor by a resistor; and
    a controller to control the first second transistors.

2. The apparatus of claim 1, wherein the first and second transistors comprise metal oxide semiconductor field-effect transistors (MOSFBT's).

3. The apparatus of claim 1, wherein the apparatus produces and amplitude modulated signal in response to the controller by:
    for a first period of time, simultaneously switching the first transistor to a frequency and deactivating the second transistor; and
    for a second period of time, simultaneously deactivating the first transistor and activating the second transistor.

4. The apparatus of claim 3, wherein the frequency is at least 13.56 megahertz.

5. The apparatus claim 1, wherein the class E amplifier includes an inductor supply current to the first transistor, and a shunt capacitor connected in parallel to the first transistor.

6. An amplifier comprising:
    a first transistor;
    an inductor coupling the first transistor to a supply voltage via a first resistor;
    a shunt capacitor connected in parallel to the first transistor;
    a second transistor connected to the inductor by a second resistor, wherein the second transistor controls a current path in parallel to the first transistor and the capacitor;
    a third transistor connected in parallel to the first resistor; and
    a controller coupled to the first, second and third transistors.

7. The amplifier of claim 6, wherein the controller selectively activates the first and second transistors.

8. The amplifier of claim 6, wherein the controller activates and deactivates the first transistor at a frequency, and activates and deactivates the second transistor.

9. The amplifier of claim 8, wherein the frequency is at least 13.56 megahertz.

10. The amplifier claim 6, wherein the controller activates and deactivates the first transistor at a frequency, and activates and deactivates the third transistor.

11. The amplifier claim 10, wherein the frequency is at least 13.56 megahertz.

12. An apparatus comprising:
    a class E amplifier having a first transistor and an inductor coupling the first transistor to a supply voltage via a first resistor;
    a second transistor connected in parallel to the first resistor; and
    a controller coupled to the first and second transistors.

13. The apparatus of claim 12, wherein the controller activates and deactivates the first transistor at a frequency, and activates and deactivates the second transistor.

14. The apparatus claim 13, wherein the frequency is at least 13.56 megahertz.

15. The apparatus of claim 12, wherein the amplifier further comprises:
    a shunt capacitor connected in parallel to the first transistor; and
    a third transistor controlling a current path in parallel to the first transistor and the capacitor.

16. The apparatus of claim 15, wherein the controller selectively activates the first and third transistors.

* * * * *

UNITED STATES PATENT AND TRADEMARK OFFICE
CERTIFICATE OF CORRECTION

PATENT NO. : 6,909,326 B2
DATED : June 21, 2005
INVENTOR(S) : Jesme, Ronald D.

It is certified that error appears in the above-identified patent and that said Letters Patent is hereby corrected as shown below:

Title page,
Item [56], References Cited, OTHER PUBLICATIONS,
"Solid-State Circuits,..." reference, delete "00118" and insert -- 0018 --.

Column 1,
Line 6, after "2001" insert -- , --.

Column 7,
Line 10, after "first" insert -- and --.
Line 13, delete "(MOSFBT'S)" insert -- (MOSEFET'S) --.
Line 24, after "apparatus" insert -- of --.

Column 8,
Lines 10 and 13, after "amplifier" insert -- of --.
Line 26, after "apparatus" insert -- of --.

Signed and Sealed this

Twenty-seventh Day of December, 2005

JON W. DUDAS
*Director of the United States Patent and Trademark Office*